(12) United States Patent
Wu

(10) Patent No.: US 11,269,020 B2
(45) Date of Patent: Mar. 8, 2022

(54) METHOD FOR TESTING SOLDER BALLS BETWEEN TWO SUBSTRATES BY USING DUMMY SOLDER BALLS

(71) Applicant: QISDA CORPORATION, Taoyuan (TW)

(72) Inventor: Po-Fu Wu, New Taipei (TW)

(73) Assignee: Qisda Corporation, Taoyuan (TW)

( * ) Notice: Subject to any disclaimer, the term of this patent is extended or adjusted under 35 U.S.C. 154(b) by 168 days.

(21) Appl. No.: 16/726,147

(22) Filed: Dec. 23, 2019

(65) Prior Publication Data

US 2020/0209323 A1 Jul. 2, 2020

(30) Foreign Application Priority Data

Dec. 27, 2018 (CN) .......................... 201811611923.5

(51) Int. Cl.
| | |
|---|---|
| *G01R 15/14* | (2006.01) |
| *G01R 15/04* | (2006.01) |
| *G01R 19/25* | (2006.01) |
| *G01R 19/00* | (2006.01) |
| *G01R 31/58* | (2020.01) |
| *G01R 1/067* | (2006.01) |
| *G01R 31/71* | (2020.01) |
| *G01R 1/04* | (2006.01) |
| *G01R 1/06* | (2006.01) |

(52) U.S. Cl.
CPC ............ *G01R 31/71* (2020.01); *G01R 1/0408* (2013.01); *G01R 1/06* (2013.01)

(58) Field of Classification Search
CPC .... G01R 31/26; G01R 31/28; G01R 31/2896; G01R 31/71; G01R 1/04; G01R 1/067; G01R 1/073; G01R 1/07314; G01R 1/07307; G01R 1/07357
See application file for complete search history.

(56) References Cited

U.S. PATENT DOCUMENTS

| | | | |
|---|---|---|---|
| 6,452,502 B1 * | 9/2002 | Dishongh .......... | G01R 31/2856 228/104 |
| 2014/0111242 A1 * | 4/2014 | Xie .................... | G01R 31/2853 324/762.02 |

* cited by examiner

*Primary Examiner* — Neel D Shah

(57) ABSTRACT

A plurality of test pads are formed on a first substrate or a second substrate. A plurality of first solder joints are reserved on a first surface of the first substrate, and each of the first solder joints is coupled to at least a test pad or to another first solder joint through at least a first trace. A plurality of second solder joints are reserved on a second surface of the second substrate. Each of the second solder joints is coupled to at least a test pad or to another second solder joint through at least a second trace. A plurality of dummy solder balls are formed between the first solder joints and the second solder joints. Probes are coupled to the test pads to measure circuit characteristics between the test pads.

11 Claims, 9 Drawing Sheets

METHOD FOR TESTING SOLDER BALLS BETWEEN TWO SUBSTRATES BY USING DUMMY SOLDER BALLS

BACKGROUND OF THE INVENTION

1. Field of the Invention

The invention relates to a method for testing a plurality of solder balls between two substrates, and more particular to a method for testing a plurality of solder balls of a ball grid array (BGA) package.

2. Description of the Prior Art

For companies that produce products of ball grid array (BGA) package, their customers will place the BGA products on motherboards by using the surface-mount technology (SMT). However, due to the structure of the BGA package, the contacts are mostly invisible and difficult to detect. Even if the BGA products have passed the test stage before leaving the factory, it does not mean that the customer will not have any problem in using them. For example, after purchasing the BGA products, the customers may perform tests, such as thermal shock, falling test, etc., resulting in breaking or abnormal functions of the solder balls of the BGA products. When investigating the cause of the problem of the BGA products, the vendor and the customer usually have different positions.

At present, the non-destructive inspection of BGA solder balls can be roughly divided into the following three types, but these methods require special and expensive instruments which cannot be used to inspect the products at any time and to check each product:

I. 2.5D X-ray inspection: Only check the inside of the BGA solder balls for large defects, such as air bubbles inside the solder balls.

II. 45 degree angle optical microscopy: Only check the outside of the BGA solder balls for large defects, such as insufficient tin. Since only the outermost area around the BGA can be observed, the solder balls inside the BGA are not visible.

III. 3D computed tomography (3D CT) inspection: Various angle cuts can be observed at any position. Any problems and defects are invisible. But the inspection is expensive, the test cost per hour is about New Taiwan dollars $12,000, and it takes an average of more than 100 hours to completely analyze a BGA product.

SUMMARY OF THE INVENTION

An embodiment of the present invention provides a method of testing a plurality of solder balls between a first substrate and a second substrate. The first substrate comprises a plurality of first traces, the second substrate comprises a plurality of second traces, and a plurality of test pads are formed on the first substrate or the second substrate. The method comprises: reserving a plurality of first solder joints on a first surface of the first substrate, each of the first solder joints being coupled to at least a test pad or to another first solder joint through at least a first trace; reserving a plurality of second solder joints on a second surface of the second substrate, the second surface facing the first surface, and each of the second solder joints being coupled to at least a test pad or to another second solder joint through at least a second trace; forming a plurality of dummy solder balls between the plurality of first solder joints and the plurality of second solder joints; and coupling a plurality of probes to the plurality of test pads to measure circuit characteristics between the plurality of test pads.

These and other objectives of the present invention will no doubt become obvious to those of ordinary skill in the art after reading the following detailed description of the preferred embodiment that is illustrated in the various figures and drawings.

DETAILED DESCRIPTION

Figure 1B:
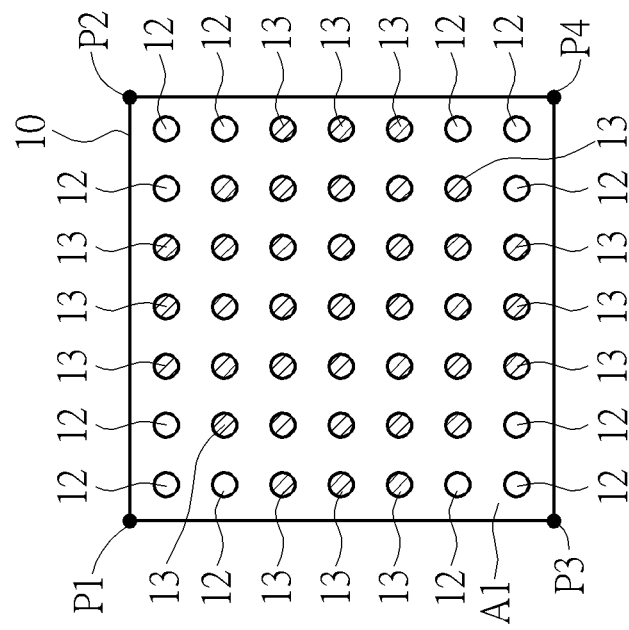
FIGS. 1A and 1B are diagrams showing an arrangement of solder joints of a first substrate and a second substrate according to an embodiment of the present invention.
Figure 1A:
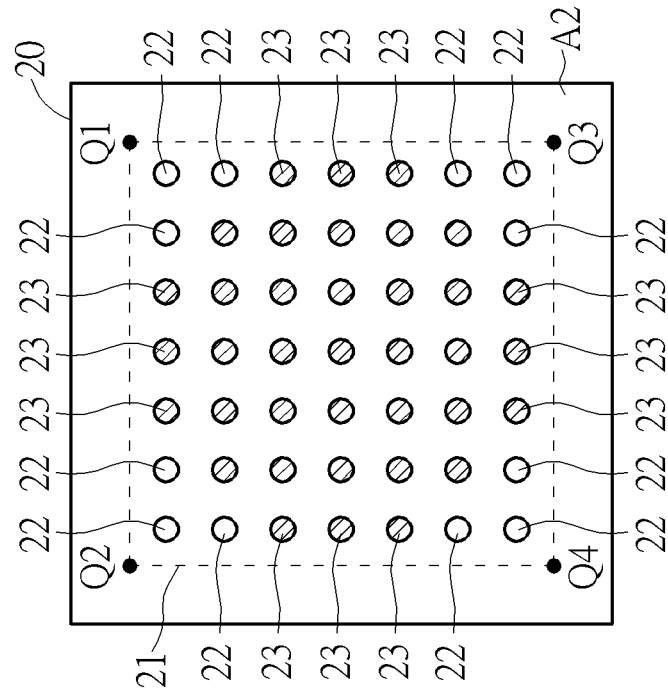
Figure 2:
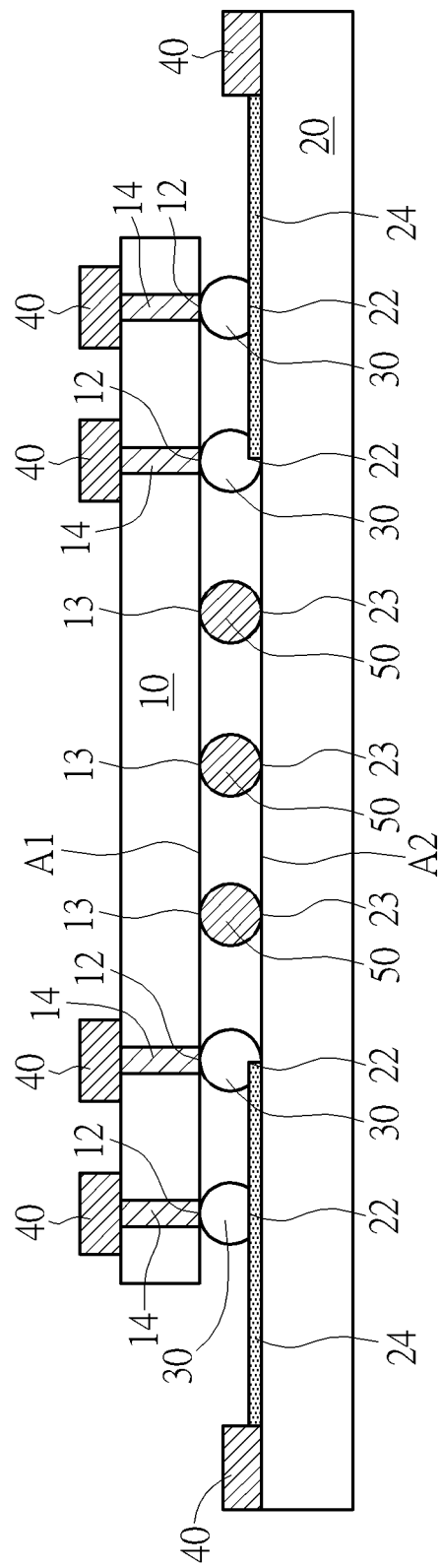
FIG. 2 is a cross-sectional diagram showing the first substrate and the second substrate in FIGS. 1A and 1B.

Please refer to FIGS. 1A, 1B and 2. FIGS. 1A and 1B are diagrams showing an arrangement of solder joints of a first substrate 10 and a second substrate 20 according to an embodiment of the present invention, and FIG. 2 is a cross-sectional diagram showing the first substrate 10 and the second substrate 20. The first substrate 10 could be disposed on the second substrate 20 by using ball grid array (BGA) packaging technology. When the first substrate 10 is disposed on the second substrate 20, a surface A1 of the first substrate 10 faces a surface A2 of the second substrate 20 (as shown in FIG. 2), and four corners P1, P2, P3, and P4 of the first substrate 10 respectively correspond to four corners Q1, Q2, Q3 and Q4 of a setting area 21 on the surface A2 of the second substrate 20.

As shown in FIGS. 1A and 1B, before the first substrate 10 and the second substrate 20 are integrated, a plurality of solder joints 12 and 13 are reserved on the surface A1 of the first substrate 10, and a plurality of solder joints 22 and 23 are reserved on the surface A2 of the second substrate 20. The solder joints 13 are coupled to an integrated circuit embedded in the first substrate 10, the solder joints 23 are coupled to another integrated circuit embedded in the second substrate 20, and a plurality of solder balls 50 would be formed between the solder joints 13 and 23 to couple the two integrated circuits in the first substrate 10 and the second substrate 20. Further, the solder joints 12 and 22 serve as dummy solder joints, and a plurality of dummy solder balls 30 may be formed between the solder joints 12 and 22. The dummy solder balls 30 and the solder balls 50 constitute a ball grid array (BGA) between the first substrate 10 and the second substrate 20. In addition, the first substrate 10 comprises a plurality of first traces 14, the second substrate 20 comprises a plurality of second traces 24, and a plurality of test pads 40 are formed on the first substrate 10 and the second substrate 20. Each of the solder joints 12 is coupled to at least one test pad 40 on the first substrate 10 or to another solder joint 12 through at least one first trace 14, and each of the solder joints 22 is coupled to at least one test pad 40 on the second substrate 20 or to another solder joint 22 through at least one second trace 24. In order to test the dummy solder balls 30 between the first substrate 10 and the second substrate 20, a plurality of probes may be coupled to the test pads 40 to measure the circuit characteristics (e.g., resistance, passing current, etc.) between the test pads 40 so as to determine whether the dummy solder balls 30 are normal according to the measured circuit characteristics. For example, if a measured resistance between the two leftmost test pads 40 (one on the first substrate 10, the other one on the second substrate 20) in FIG. 2 is too large, it indicates that the dummy solder balls 30 coupled to the two test pads 40 is probably abnormal (e.g., there is a bubble or a crack in the tested dummy solder balls 30). In contrast, if the measured resistance is small, it indicates that the dummy solder balls 30 coupled to the two test pads 40 are normal.

In addition, the dummy solder balls 30, the solder joints 12 and 22, and the test pads 40 are electrically disconnected from the two integrated circuits embedded in the first substrate 10 and the second substrate 20, and are also electrically disconnected from the solder joints 13 and 23. Therefore, the operations of the two integrated circuits in the first substrate 10 and the second substrate 20 would not be affected by the test of the dummy solder balls 30 through the test pads 40 and the solder joints 12 and 22.

Furthermore, the dummy solder balls 30 and the solder balls 50 can be formed between the surface A1 of the first substrate 10 and the surface A2 of the second substrate 20 by the same manufacturing process. Therefore, by testing the circuit characteristics (e.g., resistance, passing current, etc.) of the solder balls 30, in addition to directly knowing the quality of the solder balls 30 (e.g., whether there is damage, bubbles, etc.), the quality of the solder balls 50 can also be estimated indirectly. For example, as shown in FIGS. 1A and 1B, the solder joints 12 and 22 serving as the dummy solder joints may be disposed near the four corners P1 to P4 of the first substrate 10 and the four corners Q1 to Q4 of the setting area 21 respectively, such that an average distance of the solder joints 12 from the center of the first substrate 10 is greater than an average distance of the solder joints 13 from the center of the first substrate 10, and an average distance of the solder joints 22 from the center of the second substrate 20 is greater than an average distance of the solder joints 23 from the center of the second substrate 20. In this case, if misalignment occurs between the first substrate 10 and the second substrate 20, since the solder balls 30 located near the corners P1 to P4 and Q1 to Q4 suffer more torque than the solder balls 50, the damage of the solder balls 30 would be more severe than the solder balls 50. Therefore, in the case where the solder joints 12 and 22 and the dummy solder balls 30 are disposed near the corners P1 to P4 and Q1 to Q4, if the dummy solder balls 30 are detected to be normal, the solder balls 50 are usually normal. Conversely, if the dummy solder balls 30 are detected to be abnormal, the solder balls 50 may also be abnormal.

Further, in accordance with the measured circuit characteristics, in addition to knowing the quality of the solder balls 30, it could be further determined that whether the functions of the first substrate 10 and the second substrate 20 are normal. Please refer to Table 1 listed below. Table 1 is used to explain how to determine the quality of the dummy solder balls 30 according to the measured resistance between the two test pads 40 and to determine whether the functions of the first substrate 10 and the second substrate 20 are normal accordingly. According to the measured resistance between the two test pads 40, there are three states for distinguishing the quality of the solder balls 30. If the measured resistance is too large (e.g., more than 10 ohms), it could be determined that the dummy solder balls 30 have a significant abnormality and that the circuits in functions of the first substrate 10 and the second substrate 20 may not operate normally. If the measured resistance is not too large or too small (e.g., hundreds of milliohms), it could be determined that the dummy solders balls 30 have a small abnormality (e.g., there are small bubbles in the dummy solders balls 30, but do not affect the operations of the circuits) and that the circuits in the first substrate 10 and the second substrate 20 may still operate normally. If the measured resistance is small enough (e.g., a few milliohms), it could be determined that the dummy solder balls 30 are normal and that the circuits in the first substrate 10 and the second substrate 20 may operate normally.

TABLE 1

| Resistance | Quality of dummy solder balls | Status |
| --- | --- | --- |
| Large | Bad | Functions: abnormal<br>Solder balls: abnormal |
| Medium | OK | Functions: normal<br>Solder balls: having small defects |
| Small | Good | Functions: normal<br>Solder balls: normal |

Figure 3:
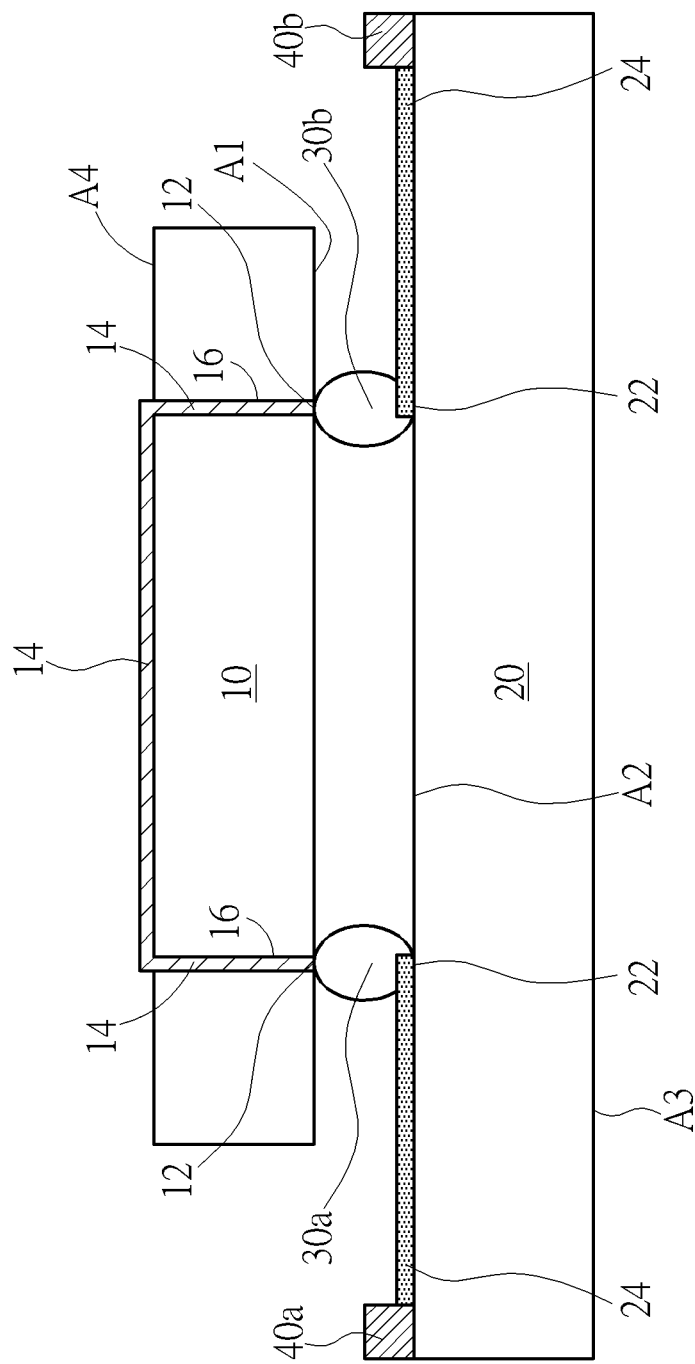
FIGS. 3 to 8 are diagrams for describing different arrangements of the first traces, the second traces and the test pads according to embodiments of the present invention.

The arrangement of the first trace 14, the second trace 24 and the test pad 40 of the present invention will be further described below with reference to the drawings. Please refer to FIGS. 3 to 8. FIGS. 3 to 8 are diagrams for describing different arrangements of the first traces 14, the second traces 24 and the test pads 40 according to embodiments of the present invention. In the embodiment of FIG. 3, two test pads 40a and 40b are formed on the second substrate 20, and no test pads are formed on the first substrate 10. Two dummy solder balls 30a and 30b are formed between the first substrate 10 and the second substrate 20, and the dummy solder balls 30a and 30b are coupled to each other by the first traces 14, and are coupled to the test pads 40a and 40b by the second traces 24. Two through holes 16 are formed between the two surfaces A1 and A4 of the first substrate 10, and two first traces 14 are formed in the two through holes 16. In addition, one of the first traces 14 is formed on the surface A4 of the first substrate 10, none of the first traces 14 is formed on the surface A1 of the first substrate 10, and the second traces 24 are formed on the surface A2 of the second substrate 20. Two probes can be respectively coupled to the test pads 40a and 40b to measure the circuit characteristics between the test pads 40a and 40b, and then it could be determined whether the dummy solder balls 30a and 30b are normal according to the measured circuit characteristics.

Figure 4:
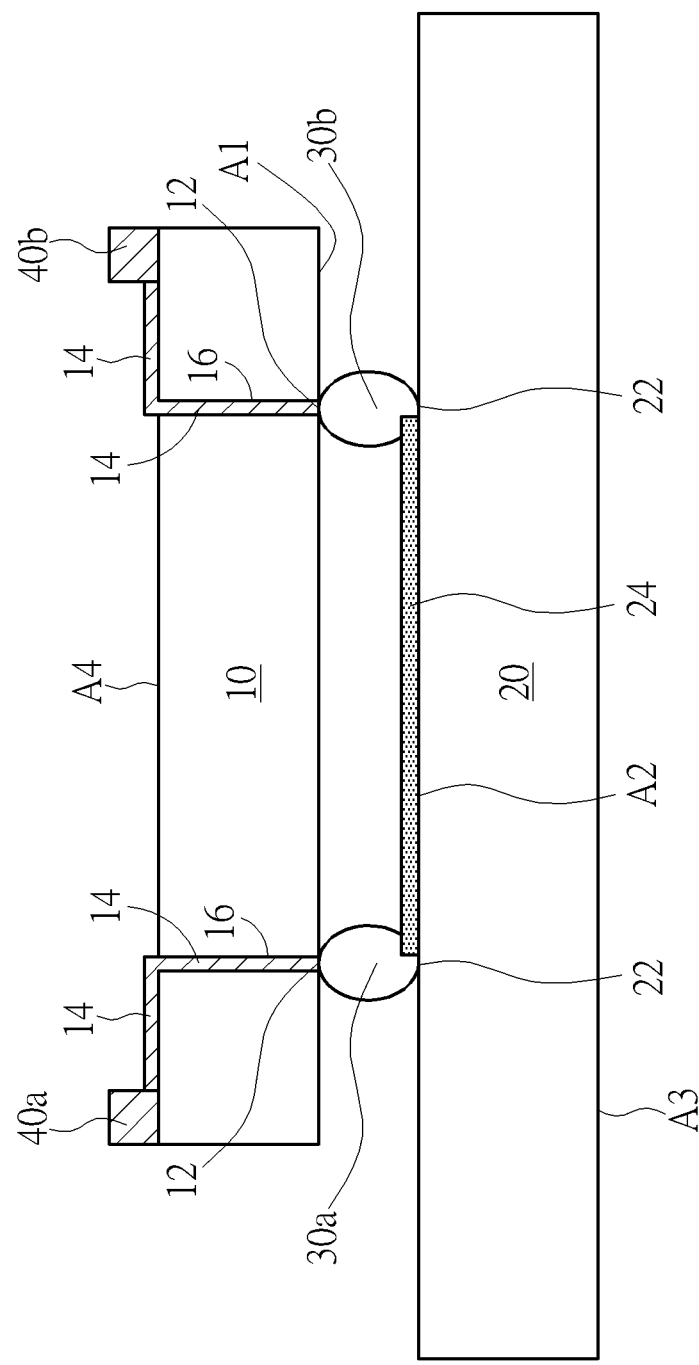

In the embodiment of FIG. 4, both test pads 40a and 40b are formed on the first substrate 10, and no test pads are formed on the second substrate 20. The two dummy solder balls 30a and 30b between the first substrate 10 and the second substrate 20 are coupled to each other by the second trace 24, and are coupled to the test pads 40a and 40b by the first traces 14. Similarly, two probes can be respectively coupled to the test pads 40a and 40b to measure the circuit characteristics between the test pads 40a and 40b, and then it could be determined whether the dummy solder balls 30a and 30b are normal according to the measured circuit characteristics.

Figure 5:
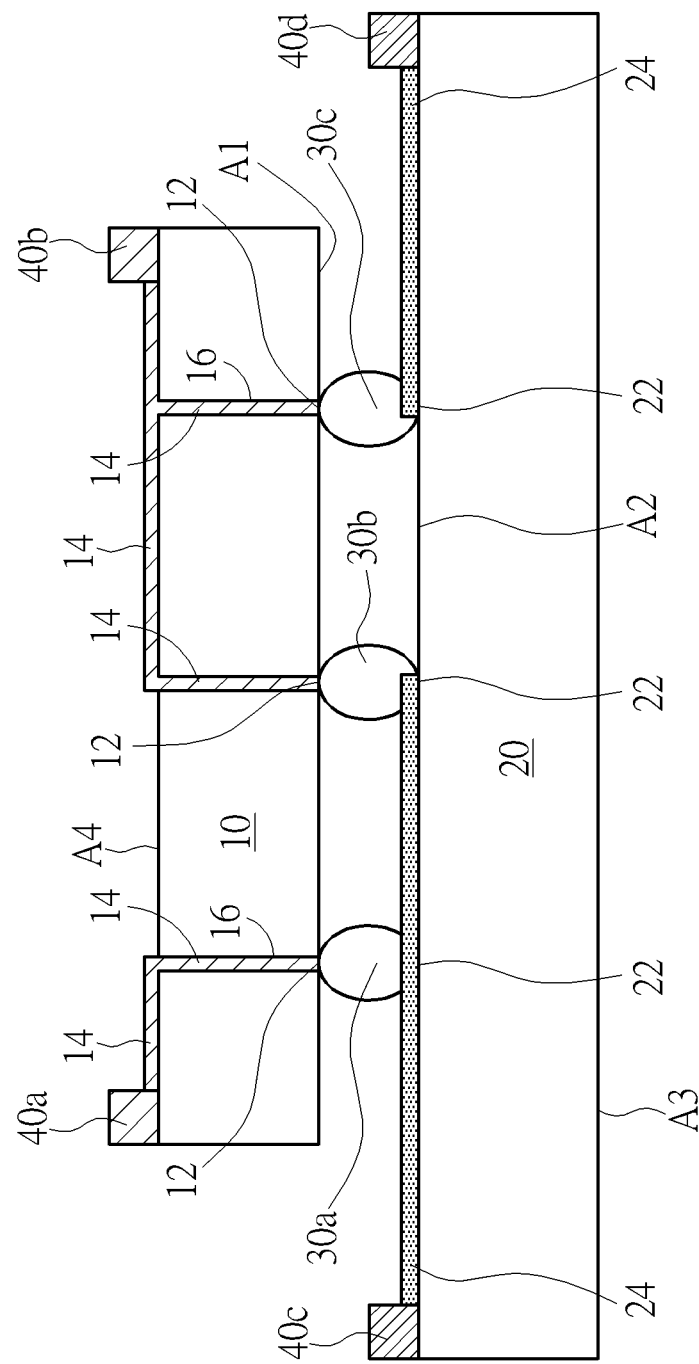

In the embodiment of FIG. 5, two test pads 40a and 40b are formed on the first substrate 10, and other two test pads 40c and 40d are formed on the second substrate 20. Three dummy solder balls 30a, 30b, and 30c are formed between the first substrate 10 and the second substrate 20. Three through holes 16 are formed between the two surfaces A1 and A4 of the first substrate 10, and three first traces 14 are formed in the three through holes 16. In addition, two of the first traces 14 are formed on the surface A4 of the first substrate 10, none of the first traces 14 is formed on the surface A1 of the first substrate 10, and the second traces 24 are formed on the surface A2 the second substrate 20. In the embodiment, two probes can be respectively coupled to any two of the test pads 40a to 40d to measure the circuit characteristics between the two test pads coupled to the two probes, and then it could be determined whether at least one of the dummy solder balls 30a, 30b and 30c is normal according to the measured circuit characteristics. For example, two probes can be respectively coupled to the test pads 40a and 40c to measure the circuit characteristics between the test pads 40a and 40c to determine whether the dummy solder ball 30a is normal. Two probes can be respectively coupled to the test pads 40a and 40b to measure the circuit characteristics between the test pads 40a and 40b to determine whether the dummy solder balls 30a and 30b are normal. Two probes can be respectively coupled to the test pads 40a and 40d to measure the circuit characteristics between the test pads 40a and 40d to determine whether the dummy solder ball 30a, 30b and 30c are normal.

Figure 6:
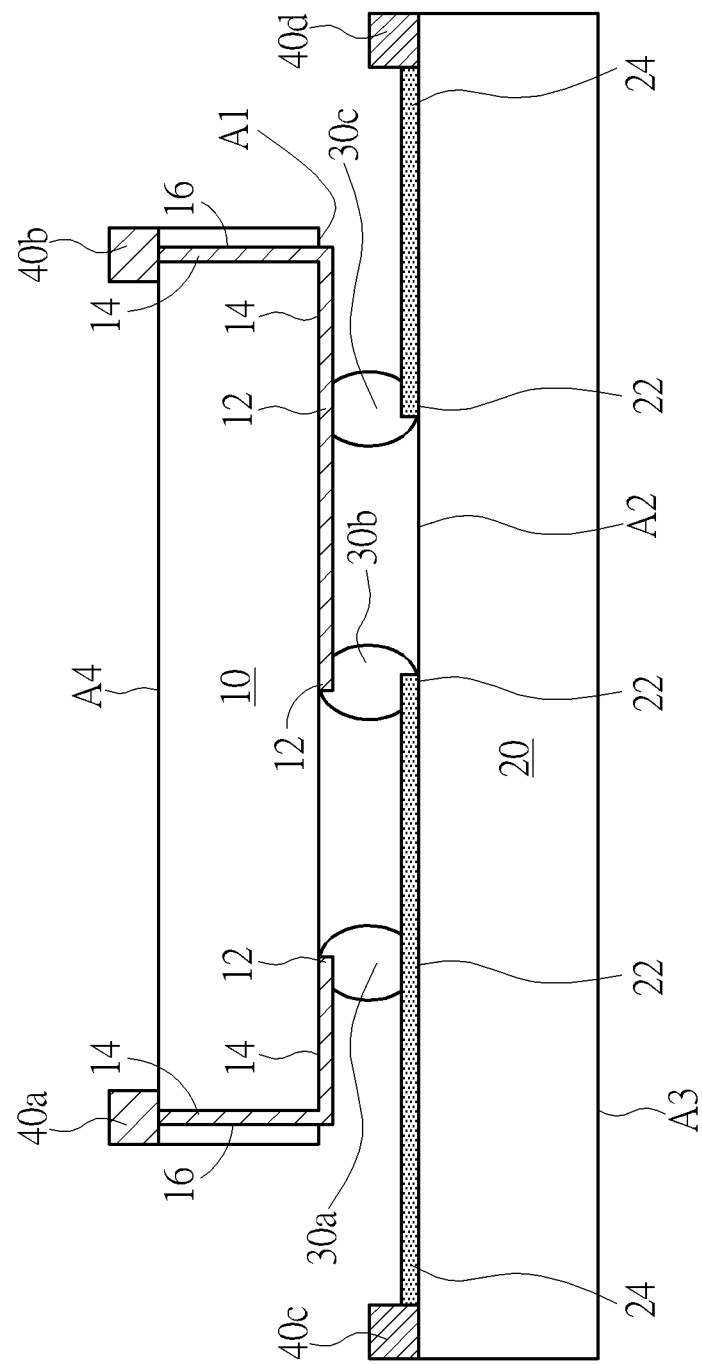

In the embodiment of FIG. 6, two test pads 40a and 40b are formed on the first substrate 10, and other two test pads 40c and 40d are formed on the second substrate 20. Three dummy solder balls 30a, 30b, and 30c are formed between the first substrate 10 and the second substrate 20. Different from the embodiment shown in FIG. 5, two of the first traces 14 are formed on the surface A1 of the first substrate 10 in FIG. 6 and none of the first traces 14 is formed on the surface A4 of the first substrate 10 as shown in FIG. 6. In this embodiment, two probes could be respectively coupled to any two of the test pads 40a to 40d to measure the circuit characteristics between the two test pads coupled to the two probes, and then it could be determined whether at least one of the dummy solder balls 30a, 30b and 30c is normal according to the measured circuit characteristics.

Figure 7:
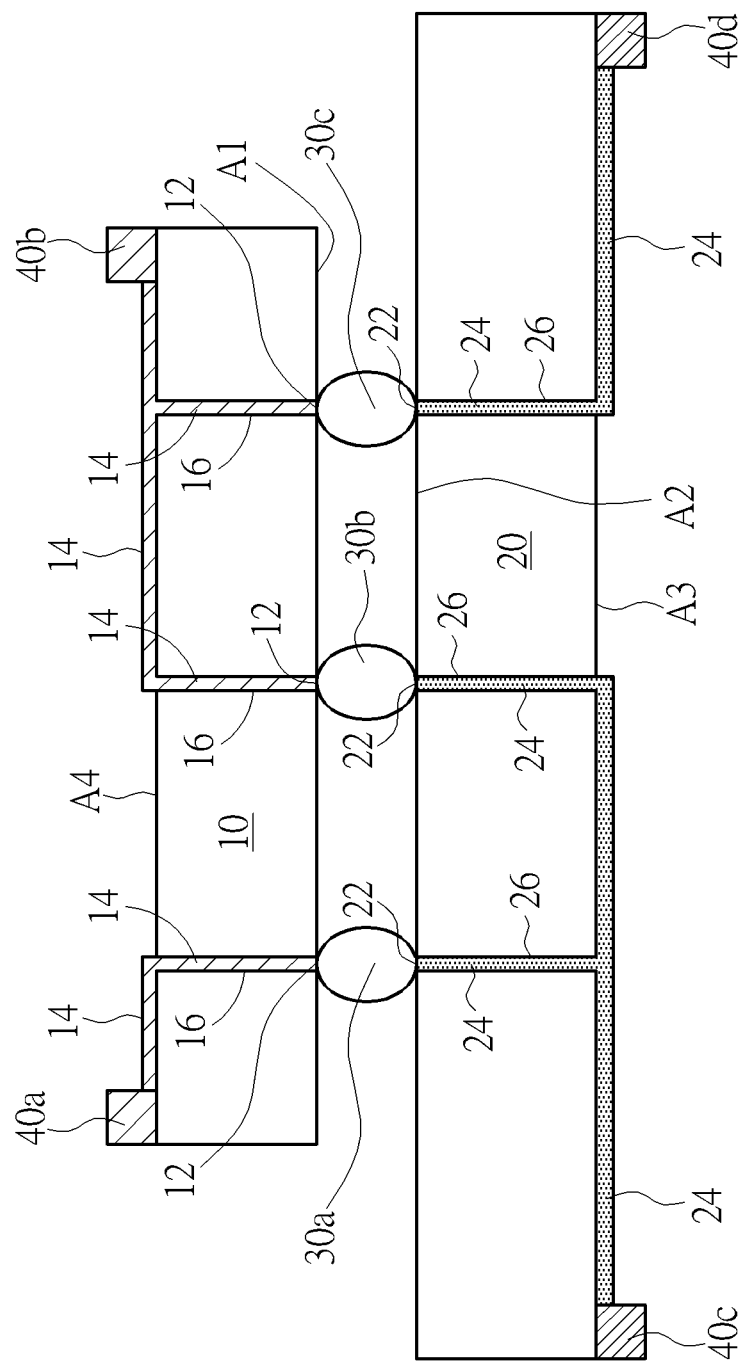

In the embodiment of FIG. 7, two test pads 40a and 40b are formed on the first substrate 10, and other two test pads 40c and 40d are formed on the second substrate 20. Three dummy solder balls 30a, 30b, and 30c are formed between the first substrate 10 and the second substrate 20. Different from the embodiment shown in FIG. 5, the two test pads 40c and 40d in FIG. 7 are formed on the surface A3 of the second substrate 20. The surface A3 and the surface A2 are two different surfaces of the second substrate 20. Further, the three through holes 16 are formed in the first substrate 10, and other three through holes 26 are formed between the surfaces A2 and A3 of the second substrate 20. Three first traces 14 are formed in the three through holes 16, and three second traces 24 are formed in the three through holes 26. Further, two of the second traces 24 are formed on the surface A3 of the second substrate 20, and none of the second traces 24 is formed on the surface A2 of the second substrate 20. Since the surface A3 does not have to be like the surface A2 to reserve a sufficient area for placing the solder joints 22, the number of the test pads 40 per unit area can be relatively reduced and selectivity of the placement positions of the test pads 40 can also be improved when the test pads 40 are set on the surface A3. In this embodiment, two probes could be respectively coupled to any two of the test pads 40a to 40d to measure the circuit characteristics between the two test pads coupled to the two probes, and then it could be determined whether at least one of the dummy solder balls 30a, 30b and 30c is normal according to the measured circuit characteristics.

Figure 8:
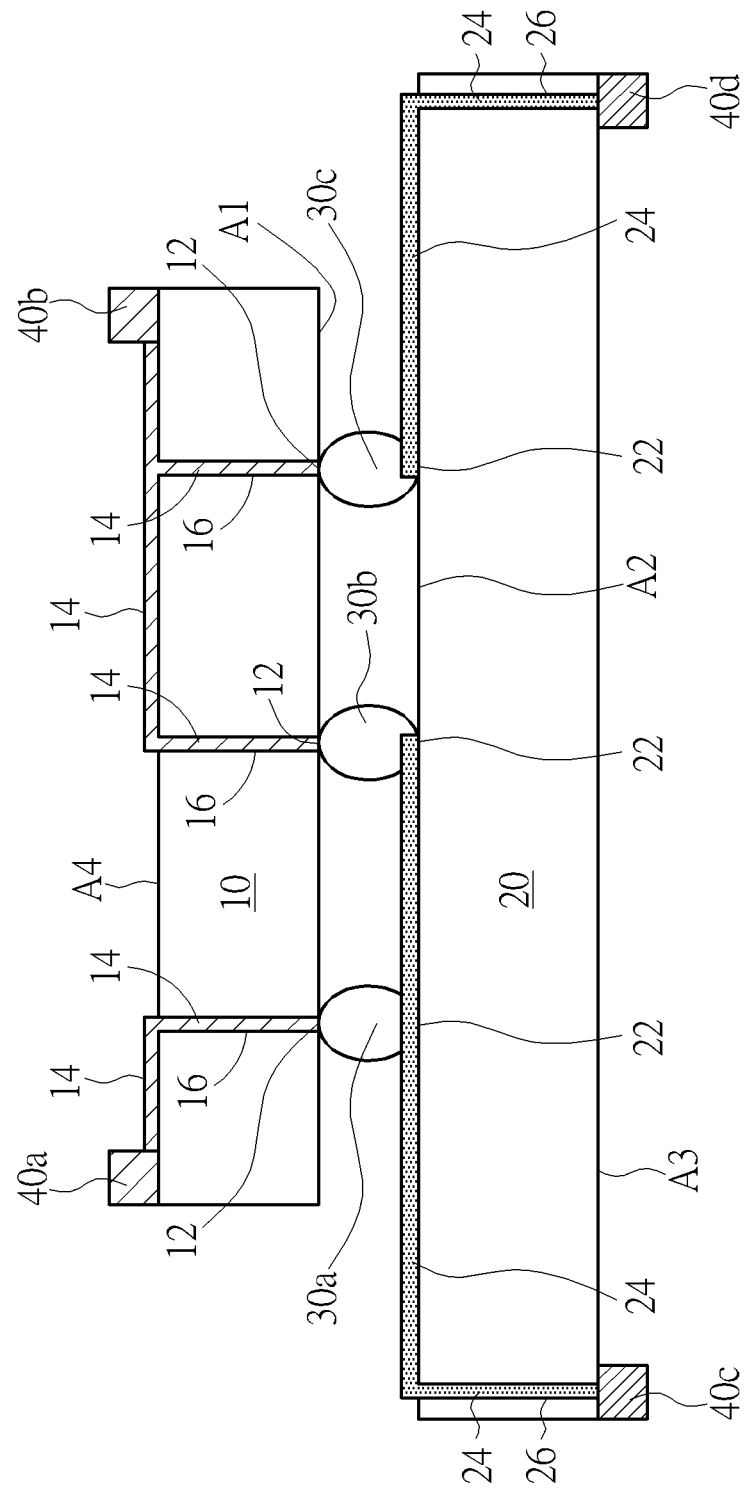

In the embodiment of FIG. 8, two test pads 40a and 40b are formed on the first substrate 10, and other two test pads 40c and 40d are formed on the second substrate 20. Three dummy solder balls 30a, 30b, and 30c are formed between the first substrate 10 and the second substrate 20. Different from the embodiment shown in FIG. 7, two through holes 26 are formed between the surfaces A2 and A3 of the second substrate 20 and two second traces 24 are formed in the two through holes 26 as shown in FIG. 8. Further, two of the second traces 24 are formed on the surface A2 of the second substrate 20, and none of the second traces 24 is formed on the surface A3 of the second substrate 20. In this embodiment, two probes could be respectively coupled to any two of the test pads 40a to 40d to measure the circuit characteristics between the two test pads coupled to the two probes, and then it could be determined whether at least one of the dummy solder balls 30a, 30b and 30c is normal according to the measured circuit characteristics.

Figure 9:
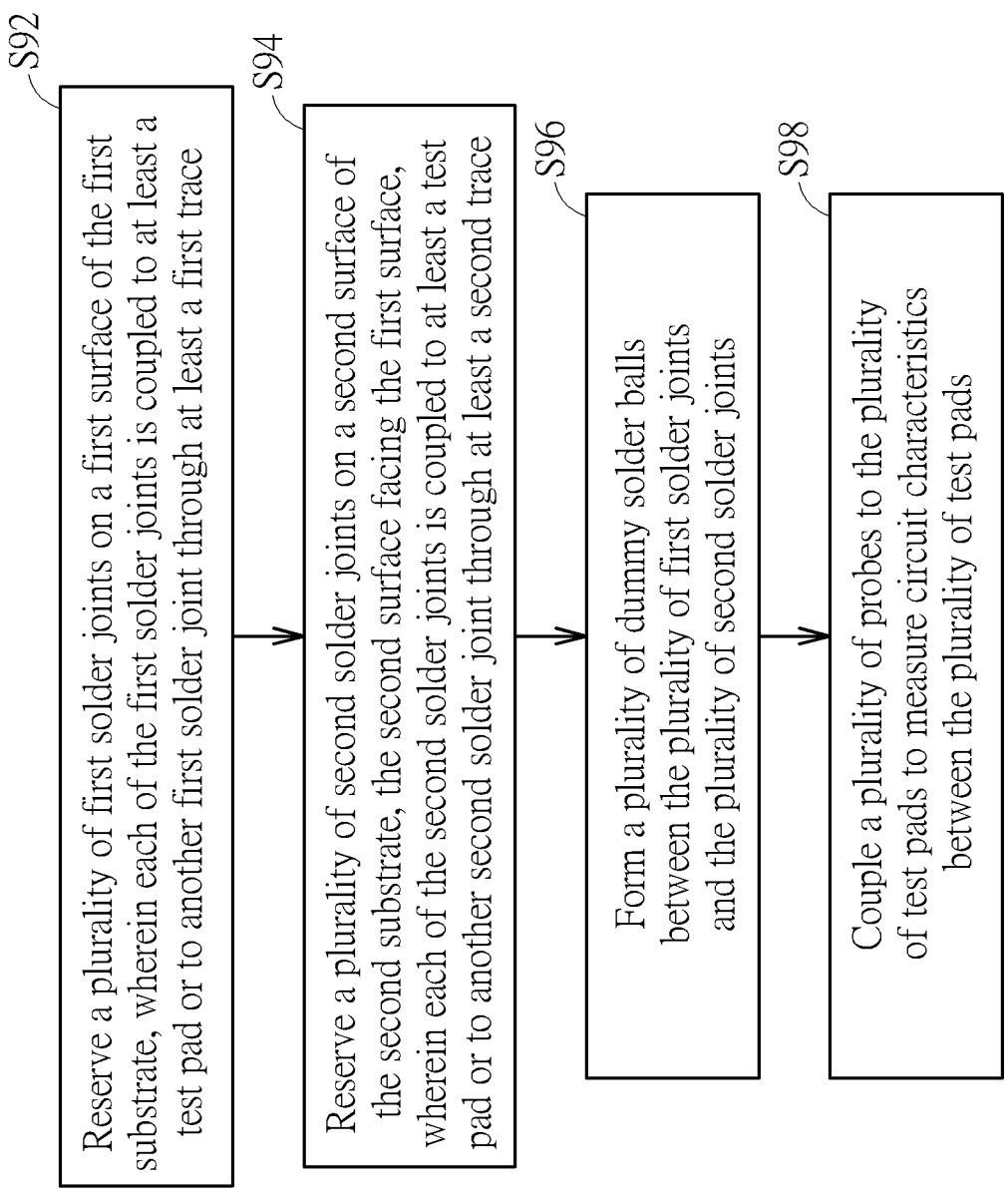
FIG. 9 is a flow chart showing a method of testing a plurality of solder balls between two substrates according to an embodiment of the present invention.

Please refer to FIG. 9. FIG. 9 is a flow chart of a method for testing a plurality of solder balls between two substrates according to an embodiment of the present invention. The method comprises the following steps:

Step S92: reserving a plurality of first solder joints (e.g., the solder joints 12) on a first surface (e.g., the surface A1) of the first substrate 10, where each of the first solder joints is coupled to at least one test pad 40 or to another first solder joint (e.g., another solder joint 12) through at least a first trace 14;

Step S94: reserving a plurality of second solder joints (e.g., the solder joints 22) on a second surface (e.g., the surface A2) of the second substrate 20 facing the first surface, where each of the second solder joints is coupled to the at least one test pad 40 or to another second solder joint (e.g., another solder joint 22) through at least a second trace 24;

Step S96: forming a plurality of dummy solder balls 30 between the first solder joints and the second solder joints; and Step S98: coupling a plurality of probes to the test pads 40 to measure circuit characteristics between the test pads 40.

Regarding the sequence of performing steps S92 and S94, in addition to performing step S92 first and then step S94, steps S92 and S94 may be performed simultaneously, or step S94 may be performed before step S92.

In summary, the present invention reserves a plurality of solder joints on two substrates, and forms a plurality of dummy solder balls between the solder joints, such that the circuit characteristics (such as resistance, passing current, etc.) of these dummy solder balls could be measured via a plurality of test pads coupled to the dummy solder balls so as to determine whether these dummy solder balls are normal. Since it is not necessary to use expensive and huge instruments as in the prior art, the measurement can be completed by only a simple instrument to obtain information on the quality of the solder balls. Accordingly, the present invention is particularly suitable for the following occasions:

a. On the factory production line, stability and consistency of the quality of the products can be monitored, instead of just using the product's function as the sole basis for quality control;

b. Both the vendor and the client can measure the changes in the circuit characteristics of the solder balls before and after the manufacturing process to quickly find out where the problem is, and no longer have different positions when investigating the cause of the problem; and c. By measuring, the golden sample and the sample with poor quality could be found quickly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of testing a plurality of solder balls between a first substrate and a second substrate, the first substrate comprising a plurality of first traces and a first integrated circuit, the second substrate comprising a plurality of second traces and a second integrated circuit, a plurality of test pads being formed on the first substrate or the second substrate and being electrically disconnected from the first integrated circuit and the second integrated circuit, the method comprising:

reserving a plurality of first solder joints on a first surface of the first substrate, each of the first solder joints being coupled to at least a test pad or to another first solder joint through at least a first trace;

reserving a plurality of second solder joints on a second surface of the second substrate, the second surface facing the first surface, and each of the second solder joints being coupled to at least a test pad or to another second solder joint through at least a second trace;

forming a plurality of dummy solder balls between the plurality of first solder joints and the plurality of second solder joints, wherein the dummy solder balls are electrically disconnected from the first integrated circuit and the second integrated circuit; and coupling a plurality of probes to the plurality of test pads to measure circuit characteristics between the plurality of test pads.

2. The method of claim 1, wherein the circuit characteristics between the test pads comprise a resistance value between any two of the test pads.

3. The method of claim 1, wherein the circuit characteristics between the test pads comprise a current flowing through any two of the test pads.

4. The method of claim 1, wherein the test pads are all formed on the first substrate.

5. The method of claim 1, wherein the test pads are all formed on the second substrate.

6. The method of claim 1, wherein some of the test pads are formed on the first substrate, and remaining test pads are formed on the second substrate.

7. The method of claim 1, wherein some of the test pads are formed on the second surface of the second substrate.

8. The method of claim 1, wherein a plurality of through holes are formed in the second substrate, and some of the second traces are formed in the through holes.

9. The method of claim 8, wherein the through holes are formed between a third surface of the second substrate and the second surface, and some of the test pads are formed on the third surface.

10. The method of claim 1, wherein the first substrate further comprises a plurality of third solder joints, the second substrate further comprises a plurality of fourth solder joints, the third solder joints are coupled to the first integrated circuit, the fourth solder joints are coupled to the second integrated circuit, the test pads are electrically disconnected from the third solder joints, and the fourth solder joints, and a plurality of solder balls are formed between the third solder joints and the fourth solder joints to couple the first integrated circuit to the second integrated circuit.

11. The method of claim 10, wherein an average distance of the first solder joints from a center of the first substrate is greater than an average distance of the third solder joints from the center of the first substrate, and an average distance of the second solder joints from a center of the second substrate is greater than an average distance of the fourth solder joints from the center of the second substrate.

* * * * *